US012656403B2

(12) United States Patent
Tsurutani

(10) Patent No.: US 12,656,403 B2
(45) Date of Patent: Jun. 16, 2026

(54) CURRENT MEASUREMENT METHOD AND CURRENT MEASUREMENT SYSTEM

(71) Applicant: HONDA MOTOR CO., LTD., Tokyo (JP)

(72) Inventor: Taisuke Tsurutani, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 225 days.

(21) Appl. No.: 18/585,102

(22) Filed: Feb. 23, 2024

(65) Prior Publication Data

US 2024/0329142 A1 Oct. 3, 2024

(30) Foreign Application Priority Data

Mar. 31, 2023 (JP) ................................. 2023-056955

(51) Int. Cl.
*G01R 31/382* (2019.01)
(52) U.S. Cl.
CPC .................................. *G01R 31/382* (2019.01)
(58) Field of Classification Search
CPC .................................................. G01R 31/382
USPC ...................... 324/500, 600, 76.11, 415–430
See application file for complete search history.

(56) References Cited

U.S. PATENT DOCUMENTS 11,664,538 B2 * 5/2023 Whitney ............. H01M 10/425
429/61
12,385,981 B2 * 8/2025 Kitagawa ............. G01R 31/389
2014/0375276 A1 * 12/2014 Zeier ..................... H01M 10/06
320/145
2017/0176225 A1 * 6/2017 Fontes ................... G01D 18/00
2022/0120817 A1 * 4/2022 Okada .................. G01R 31/367
2022/0364914 A1 * 11/2022 Kwon ........................ G01J 1/46
2023/0084779 A1 * 3/2023 Sun ........................... H02J 7/61
320/118
2025/0085375 A1 * 3/2025 Cho .................. G01R 31/3842

FOREIGN PATENT DOCUMENTS

CN 111934395 11/2020
CN 113740745 12/2021
JP 06-273452 9/1994
(Continued)

OTHER PUBLICATIONS

Japanese Notice Of Allowance for Japanese Patent Application No. 2023-056955 mailed Oct. 1, 2024.

*Primary Examiner* — Huy Q Phan
*Assistant Examiner* — Trung Q Nguyen
(74) *Attorney, Agent, or Firm* — Amin, Turocy & Watson, LLP

(57) ABSTRACT

A current measurement method includes a difference outputting step of performing sampling at a different sampling frequency for each of a plurality of signal processing parts and outputting a difference between a maximum value and a minimum value output from a signal processing part, a comparing step of outputting specified information showing the signal processing part by which a difference with a largest absolute value is output among differences output in the difference outputting step, and a deriving step of deriving a measured value of a current value between a battery and a power control unit on the basis of the current value sampled by the signal processing part shown by the specified information output in the comparing step.

8 Claims, 10 Drawing Sheets

(56)         References Cited

FOREIGN PATENT DOCUMENTS

| | | |
|----|------------|---------|
| JP | 2009-229404 | 10/2009 |
| JP | 2016-024168 | 2/2016 |
| JP | 2017-150817 | 8/2017 |
| JP | 2019-510194 | 4/2019 |
| JP | 2019-158835 | 9/2019 |
| JP | 2021-162552 | 10/2021 |

* cited by examiner

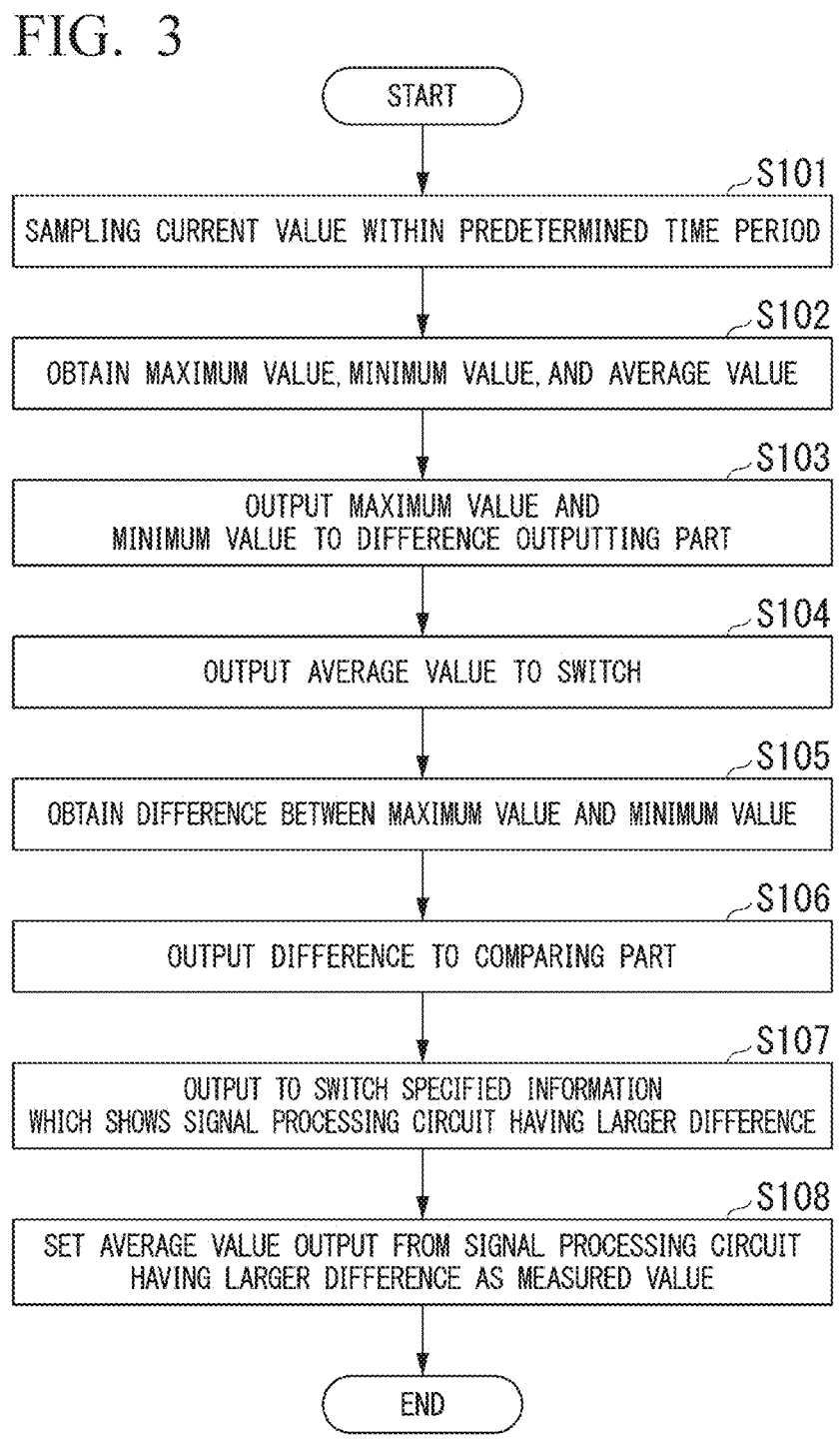

START

S101
SAMPLING CURRENT VALUE WITHIN PREDETERMINED TIME PERIOD

S102
OBTAIN MAXIMUM VALUE, MINIMUM VALUE, AND AVERAGE VALUE

S103
OUTPUT MAXIMUM VALUE AND
MINIMUM VALUE TO DIFFERENCE OUTPUTTING PART

S104
OUTPUT AVERAGE VALUE TO SWITCH

S105
OBTAIN DIFFERENCE BETWEEN MAXIMUM VALUE AND MINIMUM VALUE

S106
OUTPUT DIFFERENCE TO COMPARING PART

S107
OUTPUT TO SWITCH SPECIFIED INFORMATION
WHICH SHOWS SIGNAL PROCESSING CIRCUIT HAVING LARGER DIFFERENCE

S108
SET AVERAGE VALUE OUTPUT FROM SIGNAL PROCESSING CIRCUIT
HAVING LARGER DIFFERENCE AS MEASURED VALUE

END

CURRENT MEASUREMENT METHOD AND CURRENT MEASUREMENT SYSTEM

CROSS-REFERENCE TO RELATED APPLICATION

Priority is claimed on Japanese Patent Application No. 2023-056955, filed Mar. 31, 2023, the content of which is incorporated herein by reference.

BACKGROUND OF THE INVENTION

Field of the Invention

The present invention relates to a current measurement method and a current measurement system.

Description of Related Art

In recent years, in order to ensure that more people have access to affordable, reliable, sustainable, and advanced energy, research and development is being conducted on secondary batteries that contribute to energy efficiency (for example, see Japanese Unexamined Patent Application, First Publication No. 2009-229404).

In such a technical background, for a battery voltage of direct current, there are devices configured to switch between consumption and non-consumption by switching ON and OFF on the consumption side, for example, water heating HTR, PWM control when driving a motor, or the like. When the device is used, since the current flows to an electric resistor upon ON and the current does not flow upon OFF, the current is controlled by adjusting the width of this ON and OFF. When such a device is used, the current value is not a beautiful sine wave, but a rectangular wave. The consumption current fluctuates, for example, between 0 A and 30 A.

As a method of measuring a current value between the battery and the power control unit, as shown in FIG. 12, there is a method of AD converting a bus bar connecting the battery and the power control unit with a current sensor IC, and using the current value sampled at an appropriate sampling frequency (for example, 2.1 kHz). In FIG. 12, the current value is measured by acquiring an average of current values acquired 21 times within a 10 millisecond period using a filter and outputting the obtained average to an electronic control unit (ECU) using a LIN transceiver.

SUMMARY OF THE INVENTION

Incidentally, when current sensing is to be performed using the above-mentioned discrete sampling in a state in which a device that consumes electric power is operated by turning ON and OFF the above-mentioned switching, it may be difficult to measure the current value. In addition, in a technology related to a secondary battery, there are batteries with various specifications and use methods. In particular, in a case in which the current is input and output from the battery with a wide range of frequency, the value of the current sensor may fluctuate largely. For this reason, there is a need to measure the current value of the fluctuation with versatility in accordance with system requirements. FIG. 13 and FIG. 14 are views showing sampling examples. In each drawing, a lateral axis shows time and a longitudinal axis shows a current value. In addition, black circles indicate sampled values.

For example, when the discrete sampling frequency coincides with the operating frequency of the device that consumes energy with switching ON and OFF as shown in FIG. 13, only the apex value of the current value is sampled, and a value offset from the average consumption current may be measured. Meanwhile, as shown in FIG. 14, if the sampling frequency and the operating frequency of the device that consumes energy with switching ON and OFF are close to each other, undulation of the current measurement value with a frequency equal to the frequency difference may occur, and this is generally referred to as aliasing.

Meanwhile, in measurement of such a current value, smoothing processing may be performed. The smoothing processing at this time is, for example, averaging processing of sampling information of 10 milliseconds for 1 second, or processing of the current value=the previous value×0.99+the value obtained by sampling×0.01. For example, in the fluctuation shown in FIG. 14, when one sample takes 10 milliseconds and 10 samples look like one sine wave, if the average value for approximately 100 milliseconds is taken, the average current value will be obtained.

However, when such smoothing processing is used, a time-lag may occur due to smoothing processing, and a control response lag may occur. In addition, in the smoothing processing, if all frequency components cannot be removed and a specified frequency component is input, it may remain as a fluctuation. Meanwhile, as the method of preventing fluctuation of the measurement value, it is common to install a low pass filter of hardware using a resistor and a condenser between a sensor core and an AD converter that performs sampling. By adopting this configuration, it is possible to ensure that only a frequency component smaller than the sampling frequency remains, and by adopting this configuration, it is possible to eliminate fluctuation due to aliasing. However, since this low pass filter needs to be placed on the sensor substrate in advance, there was a problem in that once the cutoff frequency of the low pass filter was determined, the cutoff frequency could not be changed freely after that.

An aspect of the present application is directed to accomplishing a technology of measuring a more accurate current value. This contributes to efficiency of energy.

A current measurement method and a current measurement system according to the present invention employ the following configurations.

(1) A current measurement method according to an aspect of the present invention is a current measurement method in a current measurement system including a plurality of signal processing parts configured to sample a current value between a battery and a power control unit and output a maximum value and a minimum value of the current value sampled within a predetermined time, the current measurement method including: a difference outputting step of performing sampling at a different sampling frequency for each of the plurality of signal processing parts and outputting a difference between the maximum value and the minimum value output from the signal processing part; a comparing step of outputting specified information showing the signal processing part by which a difference with a largest absolute value is output among differences output in the difference outputting step; and a deriving step of deriving a measured value of the current value between the battery and the power control unit on the basis of the current value sampled by the signal processing part shown by the specified information output in the comparing step.

According to such a current measurement method, measurement is also possible for current values with a wide range of frequency.

(2) In the aspect of the above-mentioned (1), the predetermined time is a control frequency of the current measurement system, is set equal to or greater than a frequency width in which a difference of the frequency has sensitivity while including a doubling component of a frequency range in which the signal processing part can obtain a sampling frequency and is set to a frequency equal to or smaller than a control frequency of the current measurement system.

According to such a current measurement method, more accurate measurement is also possible for current values with a wide range of frequency.

(3) In the aspect of the above-mentioned (1) or (2), wherein the sampling frequency used for each of the plurality of signal processing parts is a frequency that differs by a predetermined frequency or more.

According to such a current measurement method, more accurate measurement is also possible for current values with a wide range of frequency.

(4) In the aspect of the above-mentioned (1) or (2), the signal processing part is included in a signal processing IC, and the difference outputting step, the comparing step, and the deriving step are performed by a battery control unit configured to control the battery.

According to such a current measurement method, calculation logic details upon current measurement by the battery control unit can be smoothly changed.

(5) In the aspect of the above-mentioned (1) or (2), the difference outputting step, the comparing step, and the deriving step are performed by the signal processing IC. According to such a current measurement method, a signal communication traffic volume with the battery control unit can be reduced.

(6) A current measurement method according to an aspect of the present invention is a current measurement system including a plurality of signal processing parts configured to sample a current value between a battery and a power control unit and output a maximum value and a minimum value of the current value within a predetermined time, the current measurement system including: a difference outputting part configured to perform sampling at a different sampling frequency for each of the plurality of signal processing parts and output a difference between the maximum value and the minimum value output from the signal processing part; a comparing part configured to output specified information showing the signal processing part by which a difference with a largest absolute value is obtained among differences output by the difference outputting part; and a deriving part configured to derive a measured value of the current value between the battery and the power control unit on the basis of the current value sampled by the signal processing part shown by the specified information output from the comparing part.

According to such a current measurement system, measurement is also possible for current values with a wide range of frequency.

(7) In the aspect of the above-mentioned (6), the signal processing part is included in a signal processing IC, and the difference outputting part, the comparing part, and the deriving part are included in a battery control unit configured to control the battery.

According to such a current measurement system, calculation logic details upon current measurement by the battery control unit can be smoothly changed.

(8) In the aspect of the above-mentioned (6), the signal processing part is included in a signal processing IC, and the difference outputting part, the comparing part, and the deriving part are included in the signal processing IC.

According to such a current measurement system, a signal communication traffic volume with the battery control unit can be reduced.

According to the aspects of the above-mentioned (1) to (8), it is possible to accomplish a technology of measuring a current value more accurately.

BRIEF DESCRIPTION OF THE DRAWINGS

FIG. 3 is a flowchart showing processing of the signal processing IC and a battery ECU.

DETAILED DESCRIPTION OF THE INVENTION

Hereinafter, an embodiment of a current measurement system of the present invention will be described with reference to the accompanying drawings.

Figures 1, 2:
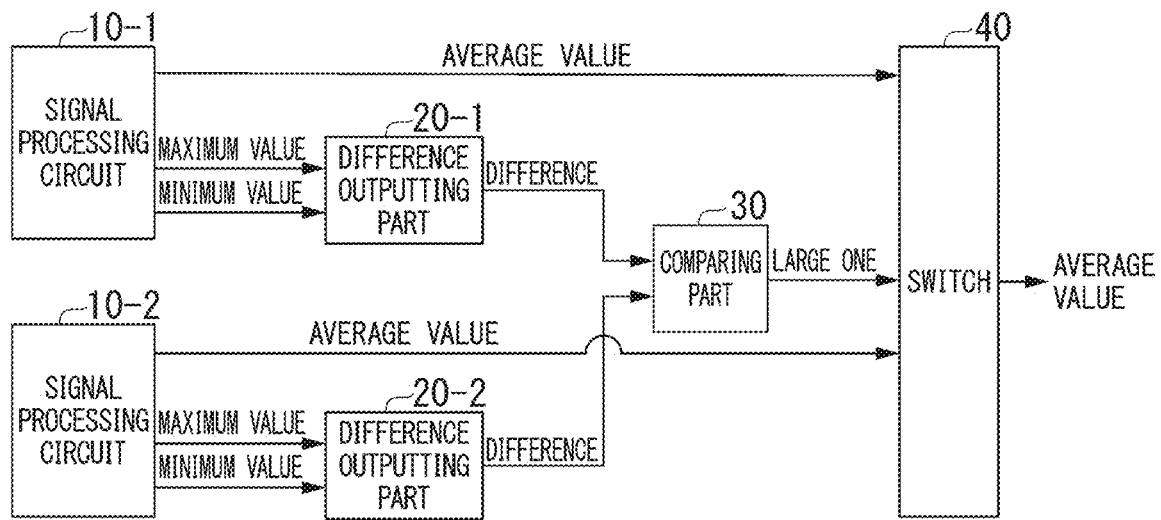
FIG. 1 is a view showing a configuration example of a current measurement system according to an embodiment.
FIG. 2 is a view showing a configuration example of a signal processing IC.

FIG. 1 is a view showing a configuration example of a current measurement system 1 according to an embodiment of the present invention. The current measurement system 1 is constituted by a current sensor 1000, a battery 300, a power control unit (PCU) 400, a motor 500, and a battery electronic control unit (ECU) 600.

The battery ECU 600 (battery control unit) is a control device configured to control output or the like of the battery 300. The battery 300 supplies electric power to the PCU 400. The output from the battery 300 at this time is repeatedly turned ON and OFF by the battery ECU 600. Accordingly, the electric power is supplied in the form of a rectangular wave. The PCU 400 controls the motor 500.

The current sensor 1000 is provided between the battery 300 and the PCU 400. The current sensor 1000 is constituted by a sensor core 100, and a signal processing integrated circuit (IC) 200. The sensor core 100 senses a current value between the battery 300 and the PCU 400, and outputs it to the signal processing IC 200.

FIG. 2 is a view showing a configuration example of the signal processing IC 200. The signal processing IC 200 includes a plurality of signal processing circuits 10-1 and 10-2. When each of the signal processing circuits 10-1 and 10-2 is not discriminated, this is expressed as the signal processing circuit 10. The signal processing circuit 10 is an example of a signal processing part. The signal processing IC 200 includes a plurality of difference outputting parts 20-1 and 20-2. When each of the difference outputting parts 20-1 and 20-2 is not discriminated, this is expressed as the difference outputting part 20. The signal processing IC 200 includes a comparing part 30. The signal processing IC 200 includes a switch 40.

The signal processing circuit 10 samples the current value between the battery and the power control unit, and outputs a maximum value and a minimum value of the current value sampled within a predetermined time. Sampling frequencies of the signal processing circuit 10-1 and the signal processing circuit 10-2 are different from each other. The maximum value and the minimum value are output to the difference outputting part 20 corresponding thereto. Specifically, the signal processing circuit 10-1 outputs the maximum value and the minimum value to the difference outputting part 20-1. The signal processing circuit 10-2 outputs the maximum value and the minimum value to the difference outputting part 20-2. The signal processing circuit 10 outputs the average value of the current value sampled within the predetermined time to the switch 40. The maximum value, the minimum value and the average value of the current value output from the signal processing circuit 10 are output as digital values.

The difference outputting part 20 outputs the difference between the maximum value and the minimum value output from the signal processing circuit 10. Specifically, the difference outputting part 20-1 outputs the difference between the maximum value and the minimum value output from the signal processing circuit 10-1. The difference outputting part 20-2 outputs the difference between the maximum value and the minimum value output from the signal processing circuit 10-2. The difference is obtained by subtracting the minimum value from the maximum value. Accordingly, the difference is a value of 0 or more.

The comparing part 30 outputs the specified information showing the signal processing circuit 10 by which the difference with a largest absolute value among the differences output from the difference outputting part 20 is obtained. Specifically, the comparing part 30 outputs the specified information showing the signal processing circuit 10-1 when the difference outputting part 20-1 outputs the difference greater than that from the difference outputting part 20-2. The comparing part 30 outputs the specified information showing the signal processing circuit 10-2 when the difference outputting part 20-2 outputs the difference greater than that from the difference outputting part 20-1. Further, when the difference of the difference outputting part 20-1 is equal to the difference of the difference outputting part 20-2, for example, the specified information showing the signal processing circuit 10-1 is output.

The switch 40 outputs the average value output from the signal processing circuit 10 specified by the specified information to the battery ECU 600. The switch 40 may operate as, for example, a deriving part. The battery ECU 600 derives the input average value as the measured value of the current value between the battery 300 and the PCU 400.

FIG. 3 is a flowchart showing processing of the signal processing IC 200 and the battery ECU 600 described above in detail. In FIG. 3, the signal processing circuit 10 samples a current value within a predetermined time period (step S101). The signal processing circuit 10 obtains the maximum value, the minimum value, and the average value of the sampled current value (step S102). The signal processing circuit 10 outputs the maximum value and the minimum value to the difference outputting part 20 (step S103), and outputs the average value to the switch 40 (step S104).

The difference outputting part 20 obtains the difference between the maximum value and the minimum value (step S105), and outputs the difference to the comparing part 30 (step S106). The comparing part 30 outputs the specified information, which shows the signal processing circuit 10 having the larger difference, to the switch 40 (step S107). Accordingly, the switch 40 outputs the average value output from the signal processing circuit 10 shown by the specified information to the battery ECU 600. The battery ECU 600 derives the average value output from the signal processing circuit on the large difference side as the measured value (step S108).

In the above-mentioned configuration, while the battery ECU 600 is configured to measure the current value, there is no limitation thereto. For example, while the signal processing circuit 10 is included in the signal processing IC 200, the difference outputting part 20, the comparing part 30 and the switch 40 may be included in the battery ECU 600. Alternatively, a configuration of measuring the current value of the battery ECU 600 may be included in the signal processing IC 200. That is, the signal processing circuit 10, the difference outputting part 20, the comparing part 30, and deriving part may be included in the signal processing IC 200.

Figure 4:
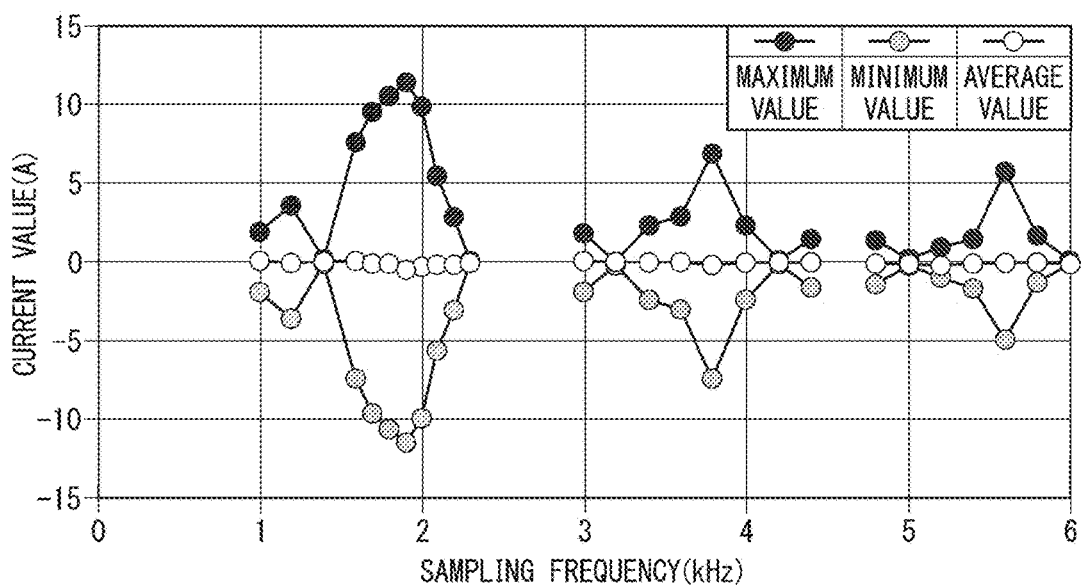
FIG. 4 is a graph showing a sampling frequency, a maximum value, a minimum value, and an average value.

Next, the aliasing and the sampling frequency will be described. FIG. 4 is a graph showing the sampling frequency, the maximum value, the minimum value, the average value. In the graph shown in FIG. 4, a lateral axis represents the sampling frequency, and the longitudinal axis represents the current value. As shown in FIG. 4, it can be seen that the frequency causing the aliasing has a width. Further, in FIG. 4 and the graph showing the current value used in the following, the original current value is a value corrected using offset so that the average value of the current value is 0.

Figure 5:
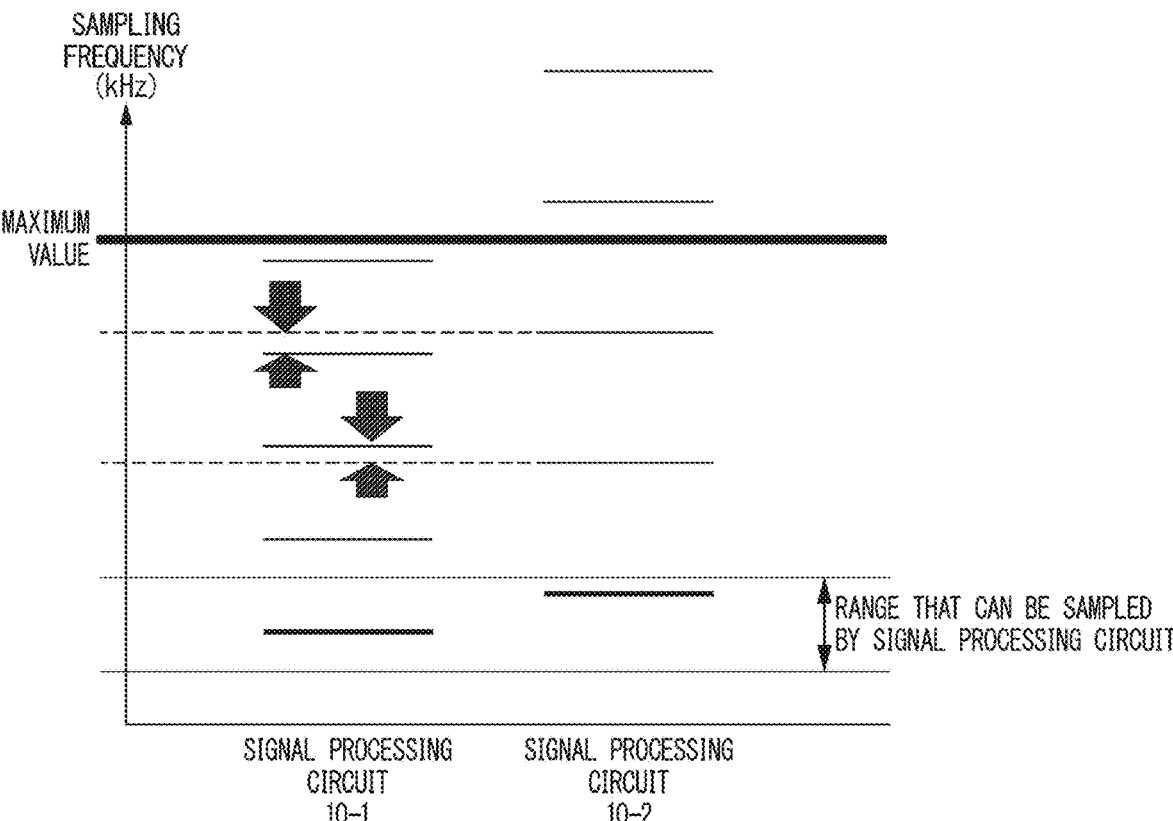
FIG. 5 is a view for describing a method of adjusting a sampling frequency.

Next, a method of adjusting the sampling frequency of the signal processing circuits 10-1 and 10-2 will be described. FIG. 5 is a view for describing the method of adjusting the sampling frequency. In FIG. 5, a longitudinal axis shows the sampling frequency. In FIG. 5, the "maximum value" indicates the maximum sampling frequency that can be sampled by the current measurement system 1. In addition, a range of the sampling frequency that can be sampled by the signal processing circuit 10 is shown. The sampling frequency of the signal processing circuits 10-1 and 10-2 is adjusted within the range.

As for the adjustment procedure, first, figure out the control frequency (for example, 10 msec) that is to be monitored with the current measurement system 1 is grasped. Next, the width of the sampling frequency taken as the current sensor 1000 is grasped (for example, 2.1 kHz to 4.7 kHz). Then, a frequency width having aliasing characteristics of the current sensor 1000 is grasped. Finally, as shown in FIG. 5, when the sampling frequency of the signal processing circuits 10-1 and 10-2 is shifted, two sampling frequencies are adjusted such that the difference is greater than aliasing characteristics width while including the doubling frequency component (doubling component).

Figure 6:
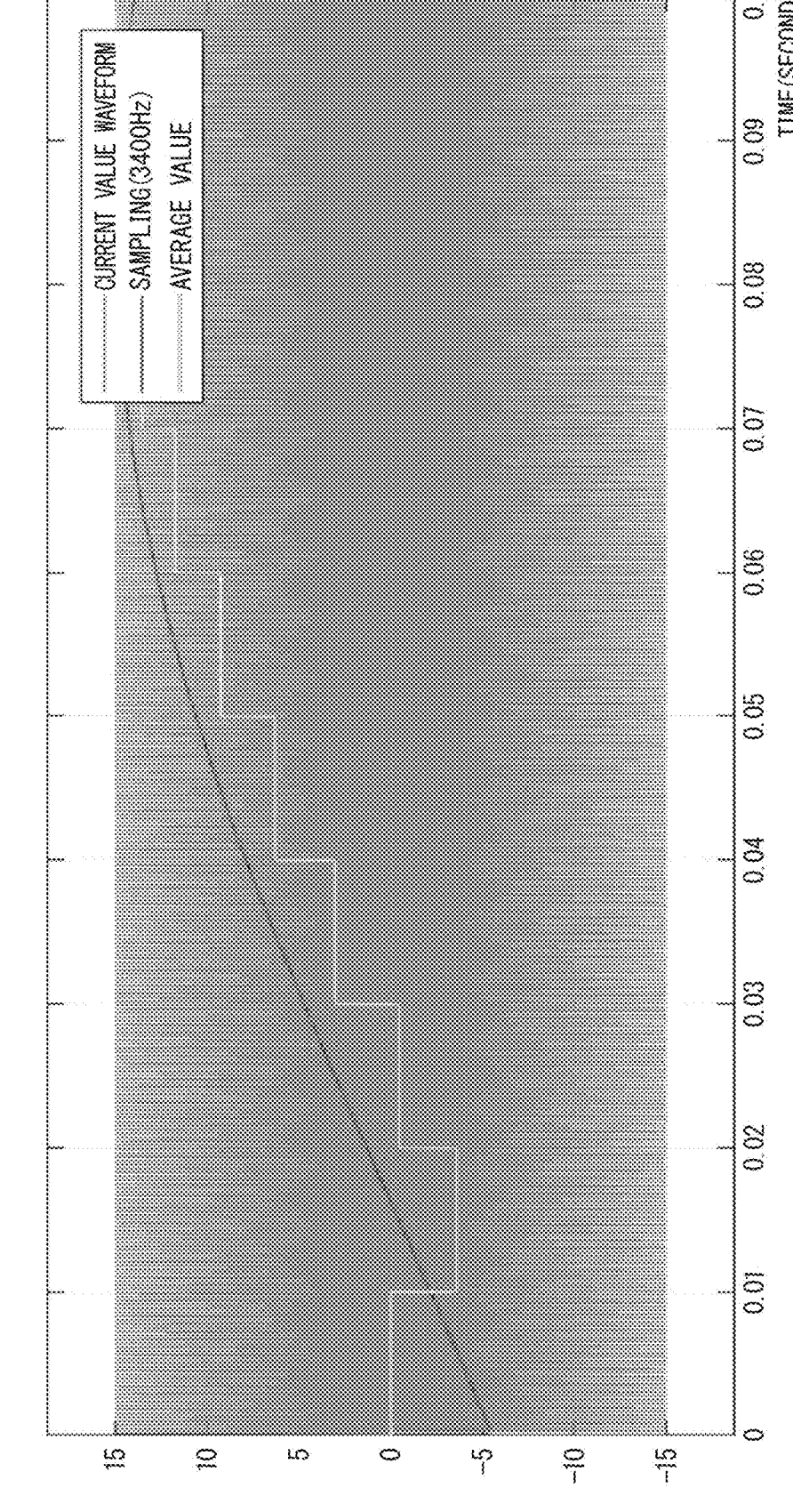
FIG. 6 is a view showing an average value or the like when a sampling frequency is 3400 Hz.
Figure 7:
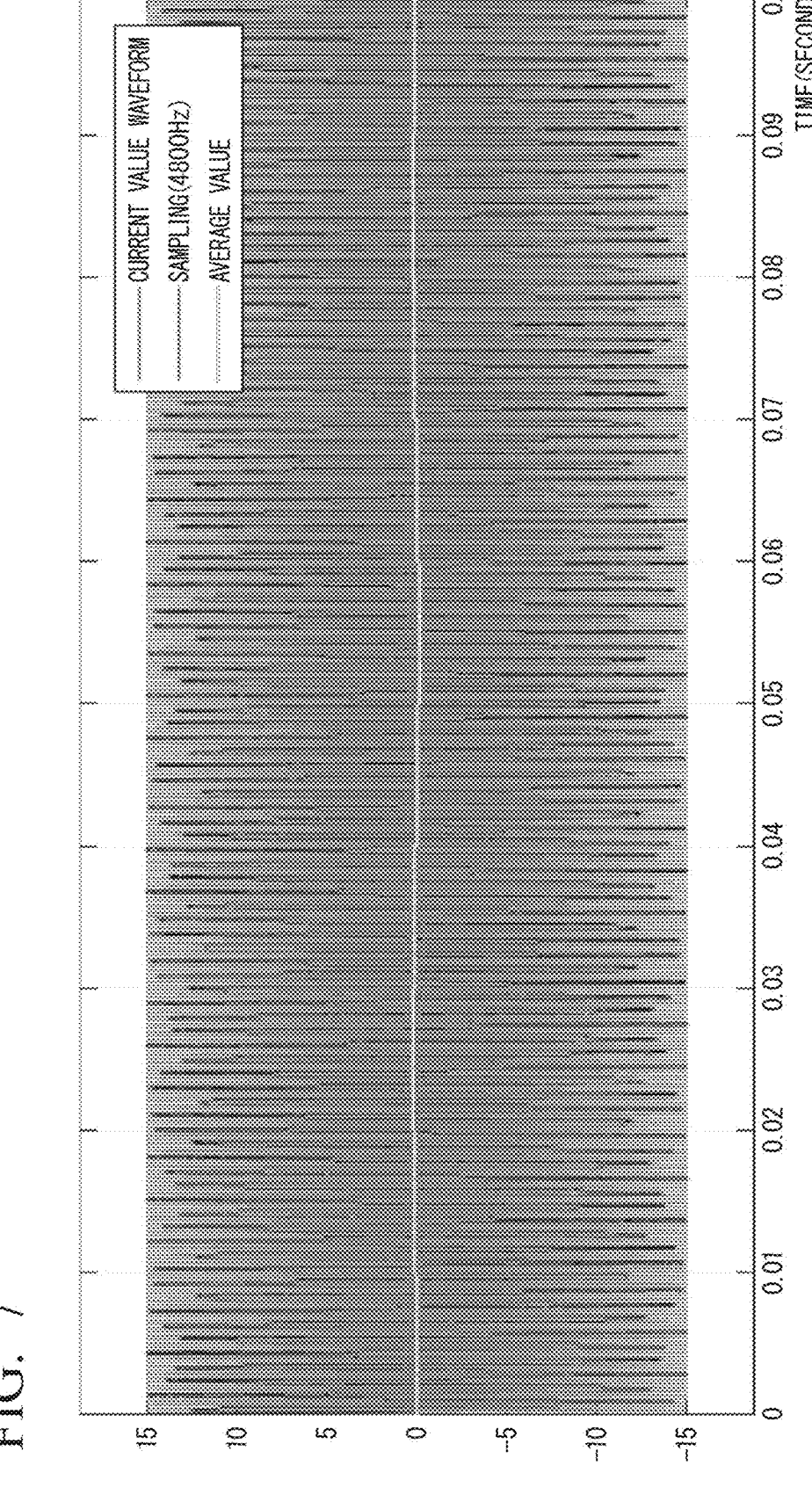
FIG. 7 is a view showing an average value or the like when a sampling frequency is 4800 Hz.
Figure 8:
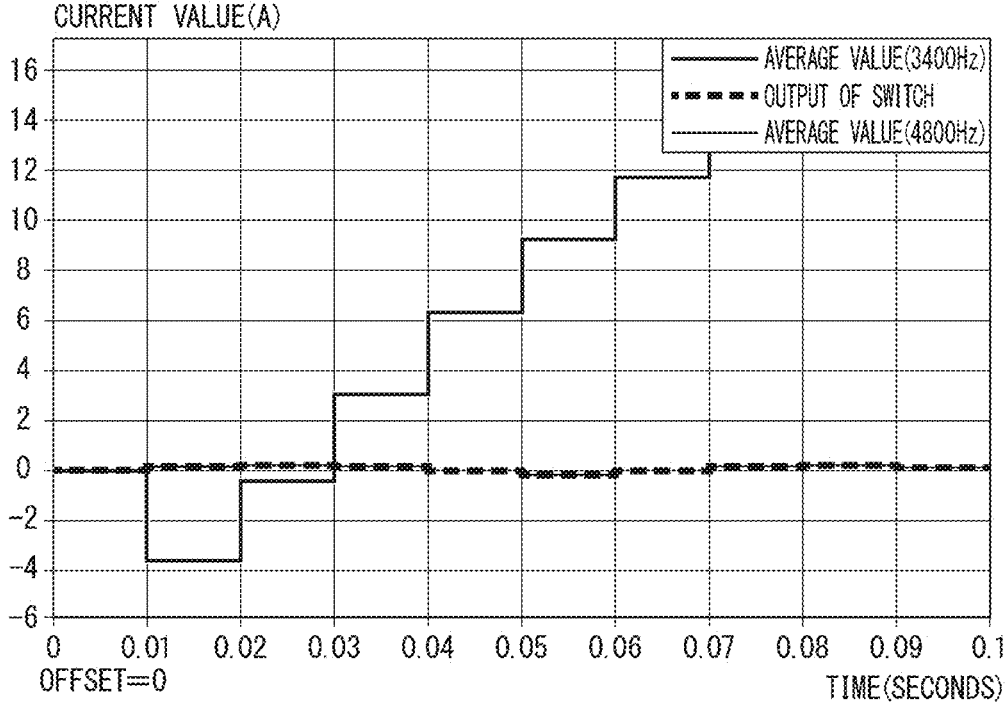
FIG. 8 is a view showing output or the like from a switch.

Next, the actually sampled result will be described. FIG. 6, FIG. 7 and FIG. 8 are views showing average values or the like when the sampling frequency of the signal processing circuit 10-1 is 3400 Hz and the sampling frequency of the signal processing circuit 10-2 is 4800 Hz in the case in which the frequency showing the rectangular shape of the current value between the battery 300 and the PCU 400 is 3400 Hz. In all the drawings, a lateral axis represents time (seconds), and a longitudinal axis represents a current value. In addition, the average value represents an average value of the current value sampled within 10 milliseconds.

As shown in FIG. 6, when the sampling frequency is 3400 Hz, low frequency undulation occurs in the average value. Meanwhile, as shown in FIG. 7, when the sampling frequency is 4800 Hz, the average value is substantially 0. Further, as shown in the sampled current value, it can be seen that, when the sampling frequency is 4800 Hz, the difference between the maximum value and the minimum value is larger within 10 milliseconds than when the sampling frequency is 3400 Hz. Accordingly, as shown in FIG. 7, the average value of the signal processing circuit 10-2 sampled at 4800 Hz is output from the switch 40.

Figure 9:
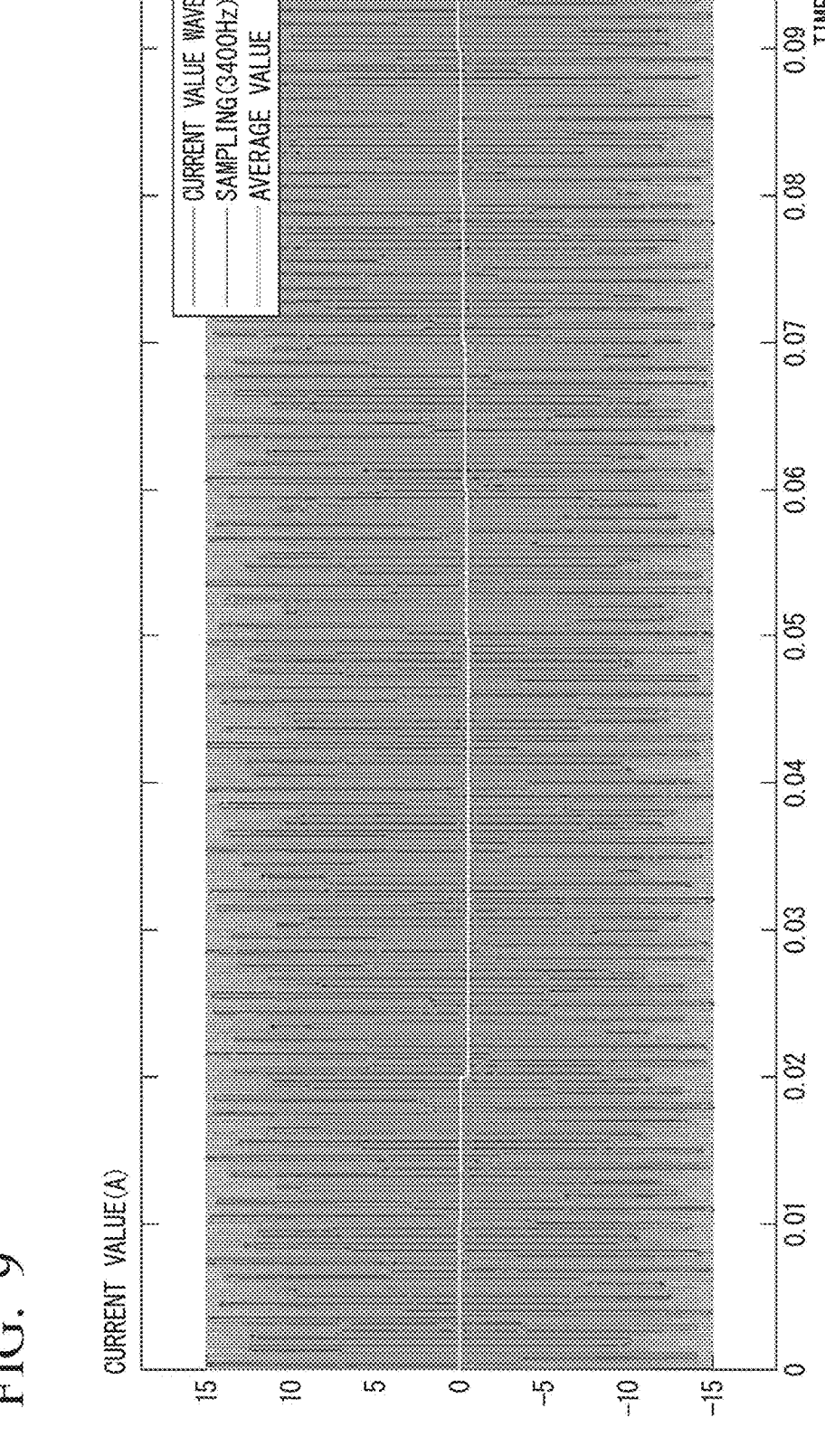
FIG. 9 is a view showing an average value or the like when a sampling frequency is 3400 Hz.
Figure 10:
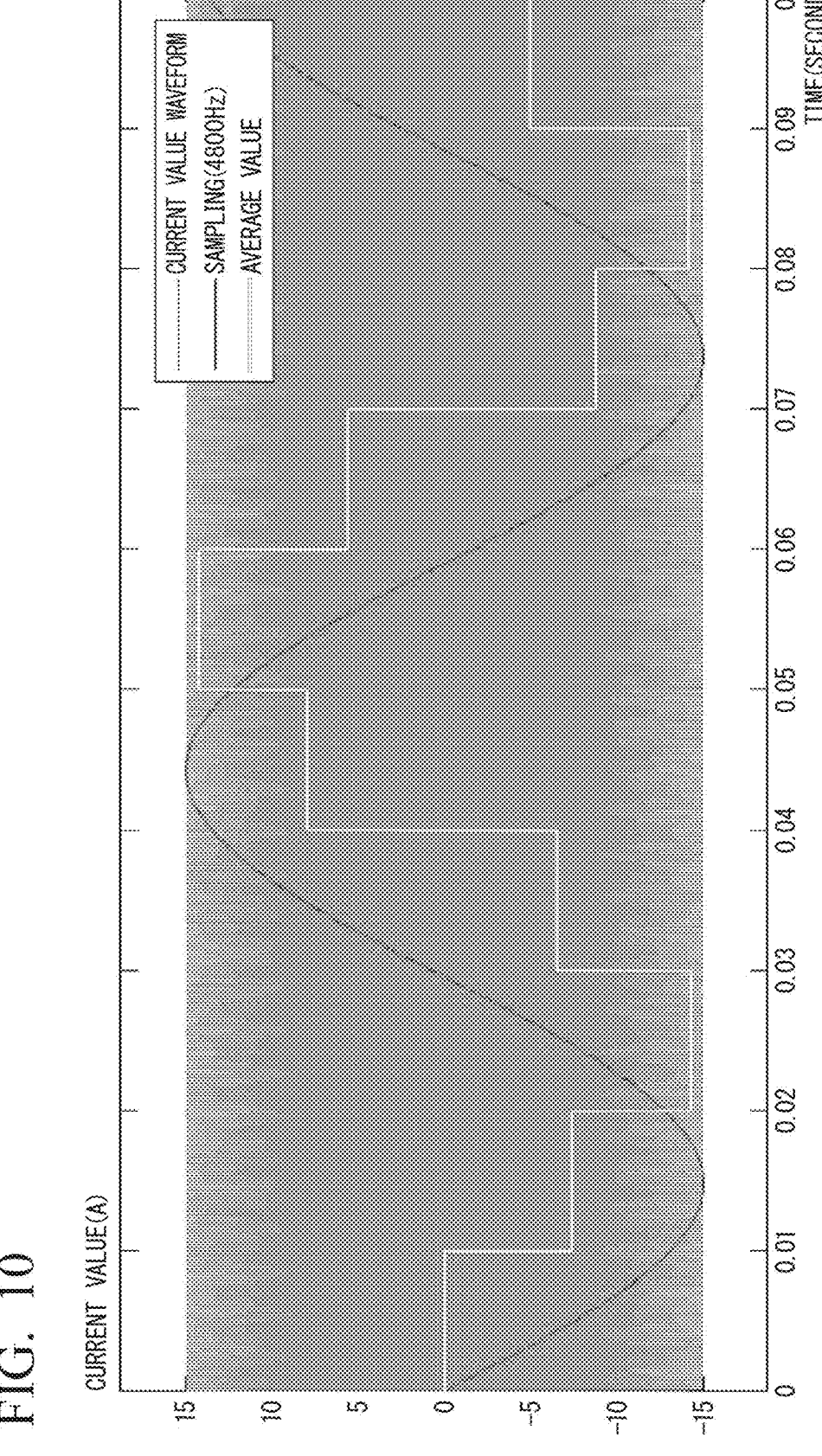
FIG. 10 is a view showing an average value or the like when a sampling frequency is 4800 Hz.
Figure 11:
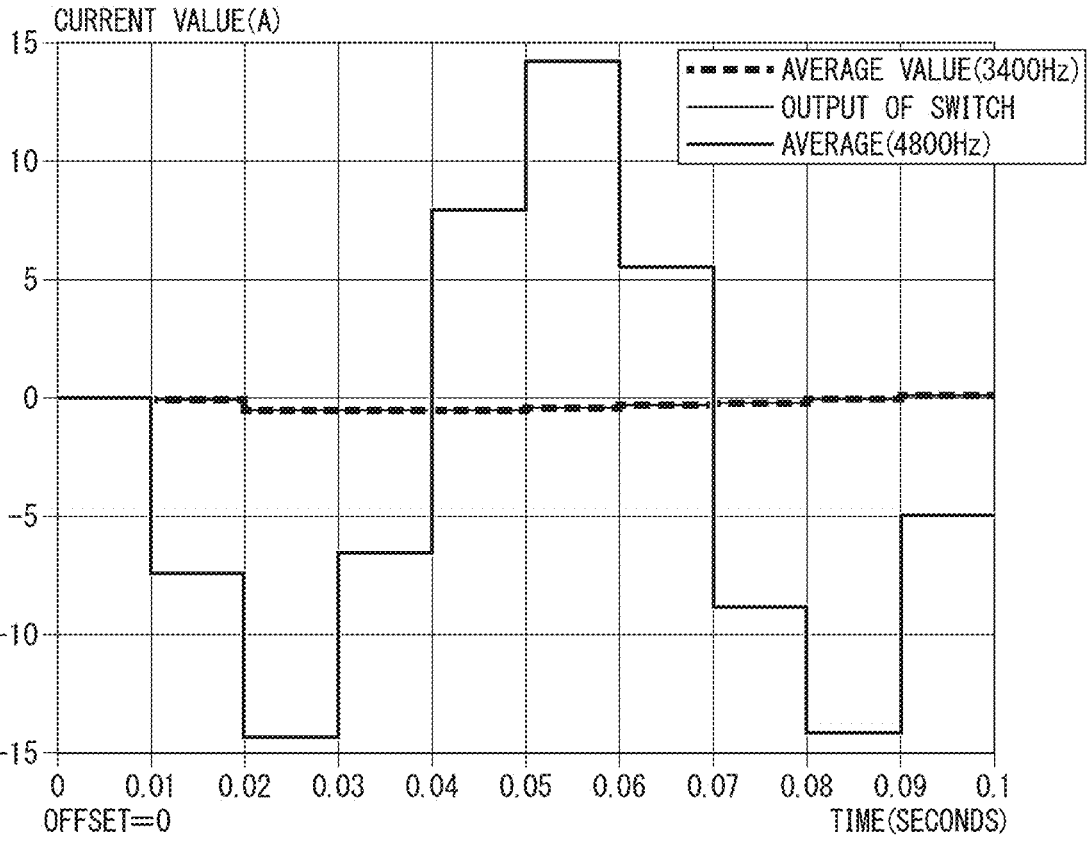
FIG. 11 is a view showing output or the like from the switch.
Figure 12:
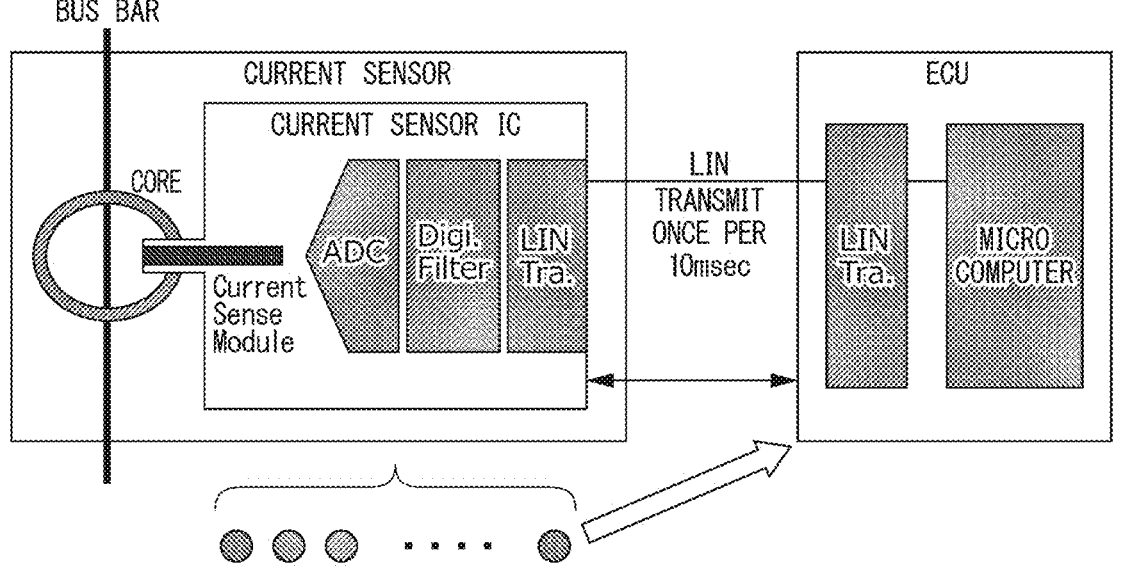
FIG. 12 is a view for describing the related art.
Figure 13:
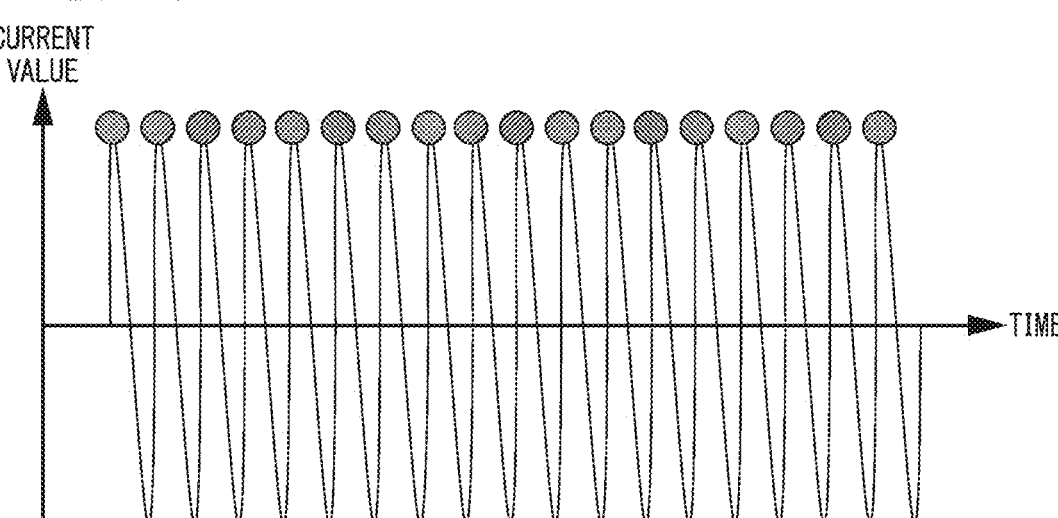
FIG. 13 is a view for describing the related art.
Figure 14:
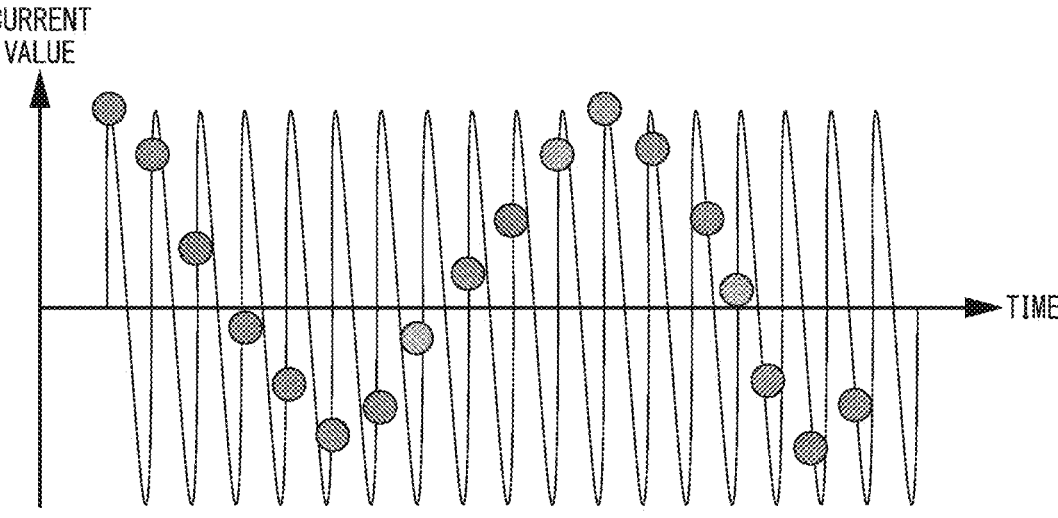
FIG. 14 is a view for describing the related art.

Next, results sampled actually at another frequency will be described. FIG. 9, FIG. 10 and FIG. 11 are views showing average values or the like when the sampling frequency of the signal processing circuit 10-1 is 3400 Hz and the sampling frequency of the signal processing circuit 10-2 is 4800 Hz in the case in which the frequency showing the rectangular shape of the current value between the battery 300 and the PCU 400 is 4800 Hz. In all the drawings, a lateral axis represents time (seconds) and a longitudinal axis represents a current value. In addition, the average value represents an average value of the current value sampled within 10 milliseconds.

As shown in FIG. 9, when the sampling frequency is 3400 Hz, the average value is substantially 0. Meanwhile, as shown in FIG. 10, when the sampling frequency is 4800 Hz, low frequency undulation occurs in the average value. Further, as shown at the sampled current value, it can be seen that, when the sampling frequency is 3400 Hz, the difference between the maximum value and the minimum value is larger within 10 milliseconds than when the sampling frequency is 4800 Hz. Accordingly, as shown in FIG. 10, the average value of the signal processing circuit 10-2 sampled at 3400 Hz is output from the switch 40.

As described above, in the embodiment, if settings of a low pass filter or the like are not appropriate for the sensing target, and fine high frequency fluctuation components that do not need to be seen by the system are seen as aliasing, it is characterized by obtaining the sensor output necessary for the system through the monitoring circuit and the processing of its sensing value. For this reason, measurement is also possible for current values with a wide range of frequency.

Then, when the current value is to be monitored within a certain predetermined time, it is equipped with another signal processing circuit with a different sampling frequency for the output of one signal processing circuit. Then, it is characterized by calculating the maximum value, the minimum value, and the average value from the current value obtained by performing finer sampling within a predetermined time to be monitored by using two signal processing circuits within the predetermined time, and determining which of the average values of the two signal processing circuits should be trusted from the relation between the maximum value and the minimum value. Then, as described above, it is characterized that the average value of the signal processing circuit with a large difference between the maximum value and the minimum value is determined to be more correct. The average value may be calculated by smoothing.

Accordingly, it is possible to reduce costs by employing two inexpensive signal processing circuits with a small sampling frequency without using a signal processing circuit configured to generate a higher frequency sampling frequency.

In addition, as another effect, in the related art, while it was necessary to change the design of the hardware filter according to a purpose and an update frequency where the processing is to be performed by the ECU, it is possible to change the sensitivity to frequency without changing the hardware filter design by setting the sampling frequency of the signal processing circuit in software.

For example, by implementing each processing of difference output, comparison, and derivation to be executed by the battery ECU 600, it is possible to flexibly change the calculation logic details during current measurement using the battery ECU 600.

In addition, by implementing each processing of difference output, comparison, and derivation to be executed by the signal processing circuit 10, it is possible to reduce a signal communication traffic volume with the battery ECU 600.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A current measurement method in a current measurement system comprising a plurality of signal processing parts configured to sample a current value between a battery and a power control unit and output a maximum value and a minimum value of the current value sampled within a predetermined time, the current measurement method comprising:

a difference outputting step of performing sampling at a different sampling frequency for each of the plurality of signal processing parts and outputting a difference between the maximum value and the minimum value output from the signal processing part;

a comparing step of outputting specified information showing the signal processing part by which a difference with a largest absolute value is output among differences output in the difference outputting step; and a deriving step of deriving a measured value of the current value between the battery and the power control unit on the basis of the current value sampled by the signal processing part shown by the specified information output in the comparing step, wherein the predetermined time is a control frequency of the current measurement system, is set equal to or greater than a frequency width in which a difference of the frequency has sensitivity while including a doubling component of a frequency range in which the signal processing part can obtain a sampling frequency and is set to a frequency equal to or smaller than the control frequency of the current measurement system.

2. The current measurement method according to claim 1, wherein the sampling frequency used for each of the plurality of signal processing parts is a frequency that differs by a predetermined frequency or more.

3. The current measurement method according to claim 1, wherein the sampling frequency used for each of the plurality of signal processing parts is a frequency that differs by a predetermined frequency or more.

4. The current measurement method according to claim 1, wherein the signal processing part is included in a signal processing integrated circuit, and the difference outputting step, the comparing step, and the deriving step are performed by a battery control unit configured to control the battery.

5. The current measurement method according to claim 1, wherein the signal processing part is included in a signal processing integrated circuit, and the difference outputting step, the comparing step, and the deriving step are performed by the signal processing integrated circuit.

6. A current measurement system including a plurality of signal processing parts configured to sample a current value between a battery and a power control unit and output a maximum value and a minimum value of the current value sampled within a predetermined time, the current measurement system comprising:

a difference outputting part configured to perform sampling at a different sampling frequency for each of the plurality of signal processing parts and output a difference between the maximum value and the minimum value output from the signal processing part;

a comparing part configured to output specified information showing the signal processing part by which a difference with a largest absolute value is obtained among differences output by the difference outputting part; and a deriving part configured to derive a measured value of the current value between the battery and the power control unit on the basis of the current value sampled by the signal processing part shown by the specified information output from the comparing part, wherein the predetermined time is a control frequency of the current measurement system, is set equal to or greater than a frequency width in which a difference of the frequency has sensitivity while including a doubling component of a frequency range in which the signal processing part can obtain a sampling frequency and is set to a frequency equal to or smaller than the control frequency of the current measurement system.

7. The current measurement system according to claim 6, wherein the signal processing part is included in a signal processing integrated circuit, and the difference outputting part, the comparing part, and the deriving part are included in a battery control unit configured to control the battery.

8. The current measurement system according to claim 6, wherein the signal processing part is included in a signal processing integrated circuit, and the difference outputting part, the comparing part, and the deriving part are included in the signal processing integrated circuit.

* * * * *